United States Patent
Kim et al.

(10) Patent No.: US 6,337,292 B1
(45) Date of Patent: Jan. 8, 2002

(54) METHOD OF FORMING SILICON OXIDE LAYER AND METHOD OF MANUFACTURING THIN FILM TRANSISTOR THEREBY

(75) Inventors: Kwang Nam Kim, Kumi; Gee Sung Chae, Incheon, both of (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/430,037

(22) Filed: Oct. 29, 1999

(30) Foreign Application Priority Data

Oct. 29, 1998 (JP) .......................................... 10-309237

(51) Int. Cl.[7] .............................................. C23C 16/50
(52) U.S. Cl. ...................... 438/787; 438/680; 438/689; 438/753; 438/757; 438/758; 438/800; 438/931; 219/121.43; 219/121.44
(58) Field of Search ................................ 438/758, 787, 438/800, 931, 680, 689, 753, 757; 219/121.43, 121.44

(56) References Cited

U.S. PATENT DOCUMENTS

| | | | |
|---|---|---|---|
| 4,937,095 A | 6/1990 | Fukatsu et al. | 427/39 |
| 5,698,062 A | 12/1997 | Sakamoto et al. | 156/345 |
| 5,736,423 A | 4/1998 | Ngo | 437/238 |
| 5,997,687 A | 12/1999 | Chishio | |
| 6,024,044 A | * 2/2000 | Law et al. | 118/723 |
| 6,072,147 A | * 6/2000 | Koshiishi et al. | 219/121.43 |

FOREIGN PATENT DOCUMENTS

| | | |
|---|---|---|
| EP | 0 678 903 A1 | 10/1995 |
| EP | 0 686 708 A1 | 12/1995 |
| EP | 0 738 003 A2 | 10/1996 |
| EP | 0 759 481 A1 | 2/1997 |
| EP | 0 874 391 A2 | 10/1998 |
| FR | 2663806 | 12/1991 |
| JP | 58181865 | 10/1983 |
| JP | 5047750 | 2/1993 |
| JP | 1064696 | 3/1998 |
| JP | 10125669 | 5/1998 |

OTHER PUBLICATIONS

WPI Accession No. 98–236540 & JP 10 074749 A (Applied), abstract only.
WPI Accession No. 90–197031 & JP 2 129377 A (NEC), abstract only.
M. Mohamed Salem et al., "Impedance Matching for Optimization of Power Transfer in a Capacitively Excited RF Plasma Reactor", European Physical Journal Applied Physics, EDP Sciences, Les Ulis, Fr, vol. 3, No. 1, 1998; pp. 91–95.

* cited by examiner

*Primary Examiner*—Charles Bowers
*Assistant Examiner*—Lisa Kilday
(74) *Attorney, Agent, or Firm*—Long Aldridge & Norman LLP

(57) ABSTRACT

The present method of forming a silicon oxide layer comprises providing two frequency excitation plasma CVD device which comprises a high frequency electrode, a susceptor electrode, and two matching box for impedance matching between the electrodes and a power supply, wherein one side electrode constituting a tuning condenser of a matching box toward the high frequency electrode is the high frequency electrode; placing a substrate on the susceptor electrode; applying high frequency electric power on the high frequency electrode and the susceptor electrode respectively; and forming a silicon oxide layer on the substrate by generating plasma with using a reaction gas of which main reaction gas is a mixing gas of monosilane and nitrous oxide.

37 Claims, 8 Drawing Sheets

METHOD OF FORMING SILICON OXIDE LAYER AND METHOD OF MANUFACTURING THIN FILM TRANSISTOR THEREBY

This application claims the benefit of Japanese Patent Application No. 1998-309237, filed on Oct. 29, 1998, which is hereby incorporated by reference.

BACKGROUND OF THE INVENTION

1. Field of the Invention

The present invention relates to a method of forming silicon oxide layer and method of manufacturing thin film transistor (TFT) thereby, and more particularly, to a method of forming silicon oxide layer preferably used as a gate insulator and an interspacing insulator.

2. Discussion of the Related Art

A liquid crystal display device (LCD) has been used widely to be minimized, lightened, and thinned, for example, an active matrix LCD of a twisted nematic (TN) mode has been known as a display device which has a low driving voltage, a small electric power consumption, a high contrast, and a high image quality.

In the active matrix LCD, a pair of substrates are opposing each other by interposing a liquid crystal layer, and one substrate between them is an active matrix substrate which has a switching element driving a pixel in each pixel.

FIG. 13 is showing a TFT which is a switching element of the active matrix substrate, and more particularly, showing a top-gate TFT. As shown in the figure, in the TFT 50, a semiconductive layer 52 is formed in an island type on a transparent substrate 51, and an interspacing insulator 53 is formed to cover the semiconductive layer 52 on the transparent substrate 51. In addition, contact holes 54, 55 are formed in the interspacing insulator 53, and source and drain electrodes 56, 57 are formed to connect the semiconductive layer 52 through the contact holes 54, 55 respectively.

Further, a passivation layer 58 is formed on the interspacing insulator 53 to cover the source and drain electrodes 56, 57, a contact hole 59 is formed in the passivation layer 58, and a pixel electrode 60 is formed to connect to the drain electrode 57 through the contact hole 59.

The semiconductive layer 52 comprises a source region 61, a drain region 62, and a channel region 63 between the source and drain regions 61, 62. And, the source electrode 56 is connected to the source region 61 and the drain electrode 57 is connected to the drain region 62. A gate insulator 64 is formed on the channel region 63 of the semiconductive layer 52, and a gate electrode 65 is formed on the gate insulator 64.

As to the TFT 50 shown in the FIG. 13, generally, the semiconductive layer 52 includes amorphous silicon (a-Si) or poly silicon (Poly-Si), the source, drain, and gate electrodes 56, 57, 65 include conductive metals, and the pixel electrode 60 is formed as a transparent conductive layer of indium tin oxide (ITO).

The insulating layer such as the gate insulator 64, the interspacing insulator 53, and the like includes silicon oxide ($SiO_2$) layer. In the TFT 50, the electric charge induced on the channel region 63 is controlled by the electric field when a voltage is applied to the gate electrode 65, which make the current flowing between the source and drain electrodes to be on or off. And then the TFT functions as a switching element.

As described above, while it is necessary an insulating layer such as the gate insulator, the interspacing insulator, and the like to the TFT, the capabilities required to the gate insulator and interspacing insulator are different from each other respectively.

The gate insulator is the best important element which affects on the electric characteristic of the TFT, for example a threshold voltage, and so on. Hence, as the material for the gate insulator, it is required that the characteristic is stable and the insulating pressure is good although the thickness of the insulating layer is thin.

On the other hand, the interspacing insulator maintains the insulation between the conductive layers by interposing between two different conductive layers as being between the gate and source electrodes, or between the gate and drain electrodes.

As shown in the FIG. 13, however, the interspacing insulator is formed according to the step of the gate electrode or semiconductive layer, so that if the step coverage of the interspacing insulator is bad, there is a problem that the insulating pressure at the steps is lowered. Therefore, it is required the interspacing insulator which has a good step coverage and particularly has a high insulating pressure at the steps.

To form the silicon oxide layer used in these insulating layers, it has been known to employ the plasma CVD using tetraethlyorthosilicate (TEOS) as the material gas. Since the silicon oxide layer of TEOS group has a good step coverage, it is suitable for the interspacing insulator. However, there are problems that the formation speed of the layer is slow, the insulating pressure is low, and so on, further it could not be used as the gate insulator. Moreover, TEOS is in a liquid state at room temperature, so that it is difficult to employ the CVD using the TEOS after vaporizing this, and there is also the matter of high costs.

In addition, to form the silicon oxide layer used in these insulating layers, it has been known to employ a plasma CVD using the mixing gas of monosilane ($SiH_4$) and nitrous oxide ($N_2O$) as the material gas. Regarding this silicon oxide layer, because the step coverage is too bad and there is a concern of generating cracks from the steps into the layer, it could be used to the gate insulator, but it is not suitable for the interspacing insulator.

As described above, as to the insulating layer in the TFT, since the capabilities required according to the uses such as the gate insulator, the interspacing insulator, and the like differ respectively, it is necessary to use the material of the insulating layer according to the uses. However in this case, because of the process limitation according to the material gas, the degree of freedom in the process is lowered and it becomes a bad manufacturing process with a small productivity.

Therefore, although the silicon oxide layer is formed by the plasma CVD using same material gas, it could be used without regard to the uses such as the gate insulator, the interspacing insulator, and the like, and then it is required for rationalizing of the manufacturing process.

SUMMARY OF THE INVENTION

Accordingly, the present invention is directed to a method of forming silicon oxide layer that substantially obviates one or more of the problems due to limitations and disadvantages of the related art.

An object of the present invention is to provide a method of forming a silicon oxide layer being used as a gate insulator and an interspacing insulator. The silicon oxide layer has good characteristics such as the insulating pressure or the step coverage, improving the yield of the TFT, having no problems of treatment or cost. And the other object of the present invention is to provide a method of manufacturing a TFT with using the silicon oxide layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method of forming a silicon oxide layer comprises the steps of:

providing two frequency excitation plasma CVD device which comprises a first high frequency power supply, a high frequency electrode connected to the a first high frequency power supply, a matching box toward the high frequency electrode having a matching circuit obtaining a matching of impedance between the first high frequency power supply and high frequency electrode; a second high frequency power supply, a susceptor electrode connected to the second high frequency power supply opposing the high frequency electrode and supporting a substrate, and a matching box toward the susceptor electrode having a matching circuit obtaining a matching of impedance between the second high frequency power supply and susceptor electrode, wherein one electrode among at lease two electrodes which constitute at least tuning condenser in the matching circuit of the matching box toward the high frequency electrode is the high frequency electrode;

placing the substrate on the susceptor electrode;

applying high frequency electric power on the high frequency electrode and the susceptor electrode respectively; and forming a silicon oxide layer on the substrate by generating plasma with using a reaction gas in which a flow ratio of the mixing gas of monosilane and nitrous oxide is 10 to 50%.

In the conventional plasma CVD device, a susceptor placing a substrate was provided in a chamber, an electrode was formed corresponding thereto, a high frequency electric power is applied to the electrode, and plasma was generated by leading a reaction gas.

As to the above constitution, the present inventors had already filed a Patent Application of two frequency excitation plasma CVD device that the susceptor placing the substrate would be an electrode and then bias electric power could be applied to the substrate.

Among the two matching box insulted into between the first high frequency power supply and high frequency electrode, and the second high frequency power supply and susceptor electrode, if one side electrode of the tuning condenser in the matching circuit of the matching box toward the high frequency electrode is used as the high frequency electrode, it is possible to obtain a plasma CVD device having the advantages that the electric power decreases, the electric power consumption efficiency is high, the layer formation speed is rapid, and then it could obtain the layer with a good quality.

Therefore, the present inventors use the two frequency excitation plasma CVD device with the matching box, the material gas of which main reaction gases are monosilane gas and nitrous oxide gas widely used in forming a silicon oxide layer. And the formation of the silicon oxide layer is performed with changing the formation condition such as the flow ratio of gases, etc.

As the result of, in the two frequency excitation plasma CVD device, if it use the reaction gas in which the flow ratio of the mixing gas of monosilane and nitrous oxide is 10 to 50%, it could obtain the silicon oxide layer as good as the silicon oxide layer of the TEOS group, although the $N_2O/SiH_4$ based silicon oxide layer is a bad step coverage compared with the conventional silicon oxide layer of the TEOS group.

As to the reaction gas, the flow ratio of nitrous oxide to monosilane is preferably 10 or more.

If the flow ratio of nitrous oxide to monosilane is 10 or more, the stoichiometric structure of the silicon oxide layer is proved by the refractivity experiment and a silicon oxide layer having a sufficiently high formation speed is obtained. From the above, the step coverage is improved, and when the flow ratio is 10 or more, the insulating pressure is enhanced, also.

As to the reaction gas of which main gases are 10 to 50% of nitrous oxide and monosilane, other gas among the reaction gas includes a gas selected from the group consisting of helium, hydrogen, xenon, oxygen, argon, nitrogen and a mixing thereof.

These gases affect secondarily to the reaction of the main reaction gas. For example, helium, hydrogen, and xenon accelerate the reaction at the point that ionization energy is high, and have an effect of improving the stability of the plasma. Oxygen supplies the quantity of oxygen ion on the formation of the layer. Argon, nitrogen accelerate the kinetic energy of the various ions generated by the main reaction gas, and then accelerate the reaction.

As to the two frequency excitation plasma CVD device, a frequency of high frequency electric power applied to the high frequency electrode is in range of 13.56 MHz to 100 MHz. If the frequency of high frequency electric power applied to the high frequency electrode is below 13.56 MHz, the potential difference between the high frequency electrode and the excited plasma is higher, the high frequency electrode is easy to be damaged and then it is not practical.

Further, when the frequency of high frequency electric power applied to the high frequency electrode is over 100 MHz, the manufacturing of the power supply is difficult, and the output is unstable, and then it is not practical.

On the other hand, if a frequency of high frequency electric power applied to the susceptor electrode is below 50 kHz, the susceptor electrode is easy to be damaged like the high frequency electrode. If the frequency is over 1.6 MHz, it is difficult to discharge between the high frequency electrode the susceptor electrode, the electric power consumption efficiency decreased, and then it is not practical.

The present invention provides the silicon oxide layer having a high formation speed of the layer and a good quality. However, in the matching box toward the high frequency electrode of the two frequency excitation plasma CVD device, a feed wire providing the high frequency electrode with the high frequency electric power in the first high frequency supply through the matching circuit is not parallel with a side wall of a housing having a conductive material in the matching box.

In the two frequency excitation plasma CVD device, the high frequency current on supplying power flows through the high frequency power supply, coaxial cable, matching circuit, feed wire, high frequency electrode, plasma space, susceptor electrode, side wall of chamber, and housing side wall of matching box.

However, if the side wall of the housing is not parallel with the feed wire, the flowing directions of the going and returning currents are not parallel with each other, and it prevents the mutual inductance from increasing. Therefore, the electric power consumption efficiency increases, and it improves the formation speed of the layer and the quality of the layer.

The present method of manufacturing a thin film transistor comprises forming a gate insulator and an interspacing insulator of the thin film transistor with the silicon oxide layer obtained by the method of forming the silicon oxide layer as described above.

From the method of forming the silicon oxide layer, it improves the electric power consumption efficiency of the plasma CVD device and the formation speed of the layer. Further, the formation speed of the layer on a small substrate increases by applying the bias electric power on the substrate, and then the step coverage becomes preferable.

Hence, the $N_2O/SiH_4$ based silicon oxide layer is able to be used as the interspacing insulator as the conventional TEOS based silicon oxide layer is. Furthermore, since the improvement of the layer quality, particularly, the improvement of the insulating pressure is obtained, it is possible to apply to the gate insulator.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiment of the present invention, example of which is illustrated in the accompanying drawings.

Figure 1:
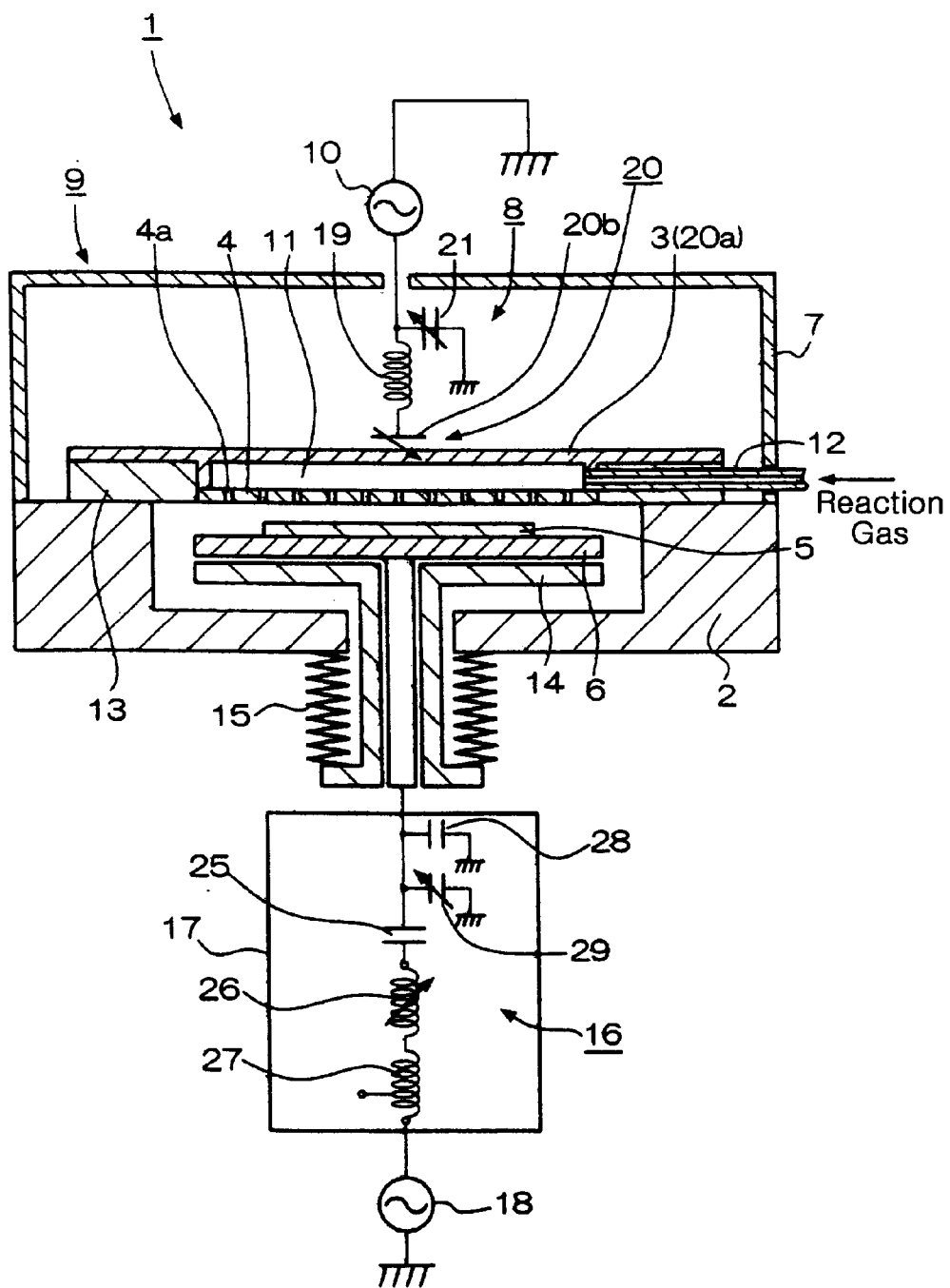
FIG. 1 is a schematic sectional view showing two frequency excitation plasma CVD device used in forming a silicon oxide layer according to an embodiment of the present invention.

FIG. 1 is a schematic sectional view showing two frequency excitation plasma CVD device 1 used in forming a silicon oxide layer according to an embodiment of the present invention.

The two frequency excitation plasma CVD device 1 comprises a high frequency electrode placed on a chamber and a susceptor electrode supporting a substrate, and applies high frequency electric power on both of the high frequency electrode and the susceptor electrode.

As shown in the FIG. 1, a high frequency electrode 3 and a shear plate 4 are mounted on a chamber 2, and a susceptor electrode 6 placing a substrate 5 is mounted corresponding to the shear plate 4 below the chamber 2. The high frequency electrode 3 is connected to a first high frequency power supply 10 by interposing a matching box toward the high frequency electrode 9 storing a matching circuit 8 in a housing 7 including conductive material.

Also, a space 11 is formed between the high frequency electrode 3 and the shear plate 4, and a gas leading pipe 12 is mounted to lead a reaction gas into the space 11. The reaction gas entered into the space 11 through the gas leading pipe 12 is provided in the chamber 2 from a plurality of holes 4a of the shear plate 4. The reference number 13 represents an insulator for insulating the high frequency electrode 3 from the wall part of the chamber 2.

A susceptor sealed 14 is mounted around the susceptor electrode 6 and the susceptor electrode 6 and the susceptor sealed 14 are constituted to move upward and downward by a bellows 15. From the above construction, the distance between the high frequency electrode 3 and susceptor electrode 6 could be controlled. Further, the susceptor electrode 6 is connected to a second high frequency electric power 18 by interposing the matching box toward the susceptor electrode 17 storing the matching circuit 16 therein.

In the matching box toward the high frequency electrode 9, the matching circuit 8 is mounted to match the impedance between the first high frequency power supply 10 and high frequency electrode 3 in the housing 7. The matching box toward the high frequency electrode 9 is a specific feature of the present invention. The detailed constitution of the matching circuit 8 is that a coil 19 and a tuning condenser 20 are connected in series to the first high frequency power supply 10, and a road condenser 21 is connected in parallel thereto and the end thereof is grounded. Between the two electrodes 20a, 20b of the tuning condenser 20, one electrode 20a is the high frequency electrode 3.

In this matching circuit 8, the impedance between the first high frequency power supply 10 and the high frequency electrode 3 is adjusted by controlling the capacity of the tuning condenser 20.

Figure 2:
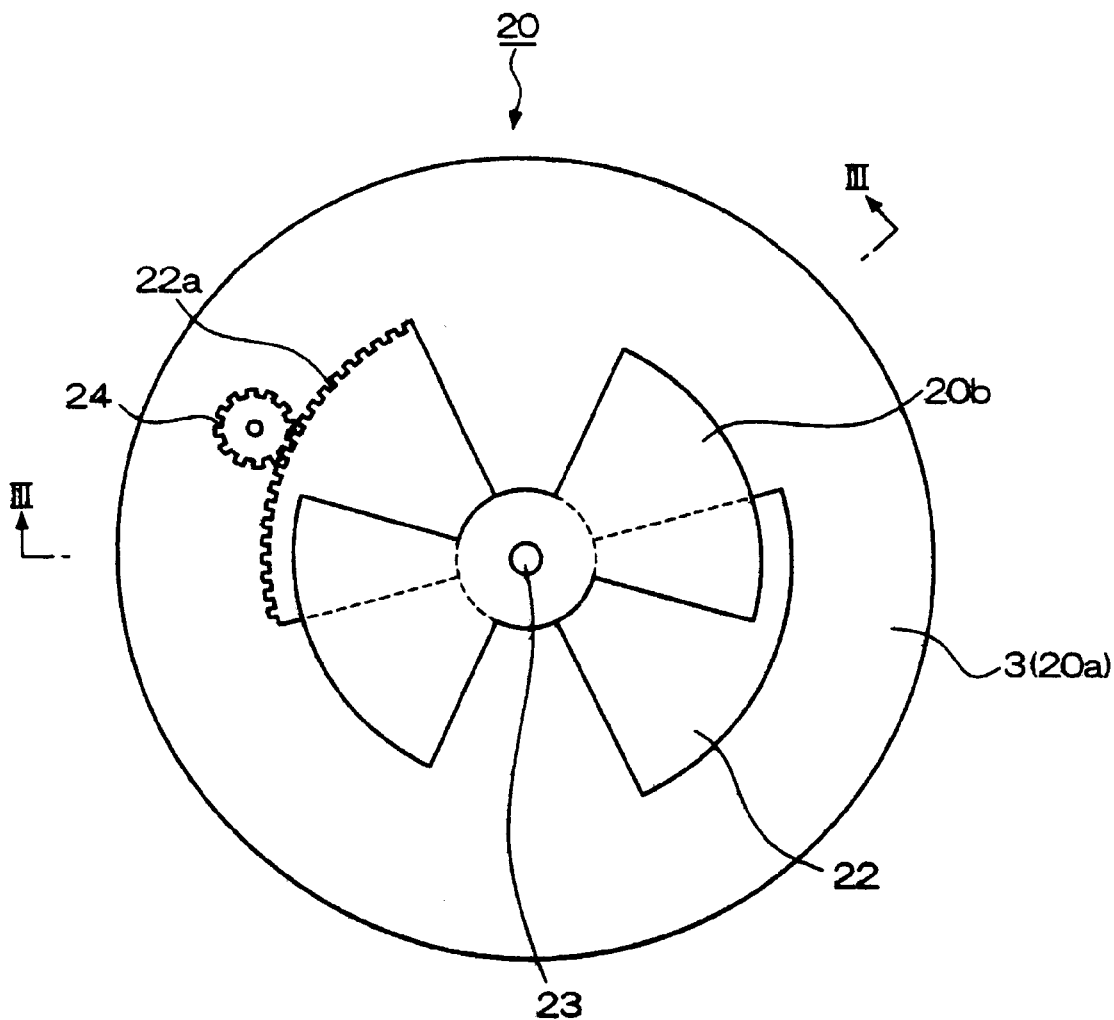
FIG. 2 is a plan view of the tuning condenser in the matching box toward the high frequency electrode of the FIG. 1.
Figure 3:
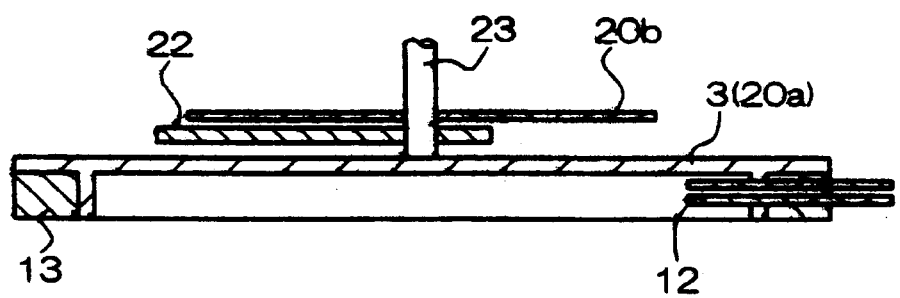
FIG. 3 is a sectional view taken along the line III—III of the FIG. 2.

FIGS. 2 and 3 are views of the tuning condenser 20 and this tuning condenser 20 is a butterfly type condenser. On the high frequency electrode 3 (also used as an electrode 20a of the tuning condenser), an insulation plate 22 having a north of a fan shape is supported to rotate on a shaft 23, and an electrode 20b is fixed to the shaft 23 to place the insulation plate 22 therebetween (the electrode 20b and the high frequency electrode 3).

In addition, from rotating the insulation plate 22 with using groove 22a and gear 24 formed thereon, the overlapped area between the electrode 20b and insulation plate 22 is changed, and then the tuning is performed the capacity between the electrodes 20a and 20b to be in a needed value.

On the other hand as shown in the FIG. 1, in the matching box 17 toward the susceptor electrode, the matching circuit 16 is mounted to match the impedance between the second high frequency power supply 18 and the susceptor electrode 6. The matching box 17 toward the susceptor electrode is a conventional type.

In the matching circuit 16, the tuning coils 26, 27 are connected in series to one side electrode of the condenser 25, and two road condensers 28, 29 are connected to the other side electrode of the condenser 25, the other ends of the road condensers are grounded.

To forming a silicon oxide layer with using the above plasma CVD device 1, the substrate 5 is placed on the susceptor electrode 6, and the high frequency electric power is applied to the high frequency electrode 3 and the susceptor electrode 6 from the first and second high frequency power supplies 10, 18. And the silicon oxide layer is formed on the substrate 5 by providing a reaction gas in the chamber 2 through the shear plate 4 in the gas leading pipe 12 and generating plasma.

As the reaction gas, the main reaction gases are monosilane and nitrous oxide and it further includes any other gases, and the flow ratio of the main reaction gas is 10 to 50%. The other gases include a gas selected from the group consisting of helium, hydrogen, xenon, oxygen, argon, nitrogen and a mixing thereof.

As to the main reaction gas, for example nitrous oxide 400 sccm to 40 sccm monosilane, it is preferable that the flow ratio of nitrous oxide to monosilane is 10 or more. From the above, the formed layer is surely the silicon oxide layer with sufficiently high formation speed of the layer.

The formation condition of the layer is, for example, 300° C. of temperature, 200 Pa of pressure, 10 of the flow ratio of nitrous oxide to monosilane, 35% (dilution with He) of the flow ratio of the mixing gas of nitrous oxide and monosilane occupied in the reaction gas, 13.56 MHz to 100 MHz of the frequency of the high frequency electric power applied to the high frequency electrode, 50 kHz to 1.6 MHz of the frequency of the substrate bias electric power applied to the susceptor electrode, and 40% of the ratio of the high frequency electric power applied to the susceptor electrode to the sum of the high frequency electric power applied to the high frequency electrode and the high frequency electric power applied to the susceptor electrode (hereinafter, it is referred to a substrate bias electric power rate).

Consequently, FIG. 4 is a manufacturing processing view showing the method of manufacturing a top-gate TFT using the silicon oxide layer as a gate insulator and interspacing insulator.

Figure 4A:
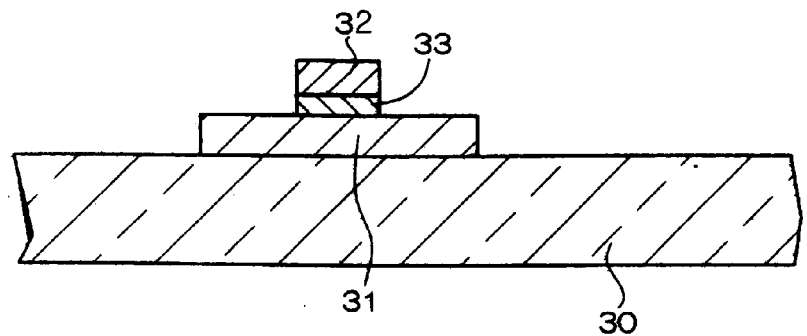
FIG. 4 is a manufacturing processing view showing the method of manufacturing a TFT using the method of a silicon oxide layer of the present embodiment.

As shown in the FIG. 4A, a semiconductive layer 31 of amorphous silicon in 500 Å of the thickness is formed on a transparent substrate 30 such as a glass, and the semiconductive layer 31 is patterned in an island shape by a photolithography process. A silicon oxide layer is formed in 300 Å of the thickness whole over the surface.

At this time, it use the two frequency excitation plasma CVD device 1 and a reaction gas of which main reaction gases are nitrous oxide to monosilane. Further, after forming a metal layer of Al and the like in 1000 Å of the thickness whole over the surface, the metal layer and the silicon oxide layer are patterned by the photolithography process, and the result thereof, the gate electrode 32 and the gate insulator 33 are formed.

Figure 4B:
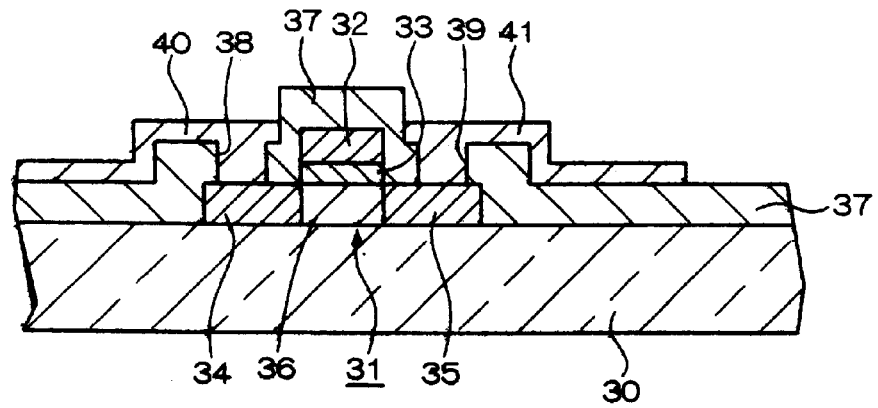

As shown in the FIG. 4B, a region except the lower side of the gate electrode 32 among the semiconductive layer 31 is made an n-type silicon layer by ion-doping impurities such as phosphorus, arsenic and so on into the upper side of the gate electrode 32, and is formed a source region 34 and a drain region 35. At this time, the region between the source and drain regions 34, 35 is a channel region 36.

An interspacing insulator 37 of silicon oxide layer in 2000 Å of the thickness is formed all over the surface. At this time, it use the two frequency excitation plasma CVD device 1 and a reaction gas of which main reaction gases are nitrous oxide to monosilane.

The interspacing insulator 37 is patterned by photolithography process, and contact holes 38, 39 are formed to reach the source, drain regions 34, 35 of the semiconductive layer 31, respectively. A metal layer of Al, etc. in 1000 Å of the thickness is formed all over the surface and patterned to form the source electrode 40 and the drain electrode 41, respectively.

Figure 4C:
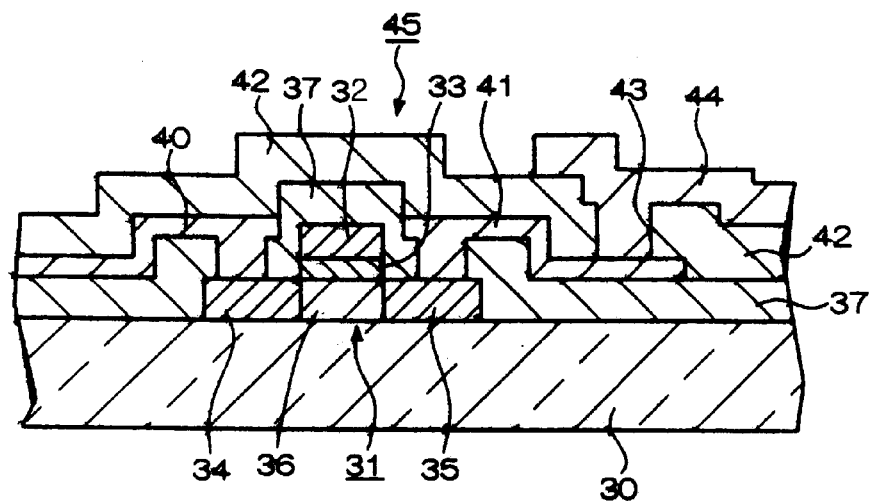

As shown in the FIG. 4C, a passivation layer 42 of silicon nitride layer is formed all over the surface, patterned by photolithography process, and then a contact hole 43 is formed to reach the drain electrode 41. In addition, a transparent conductive layer of ITO, etc. is formed all over the surface and patterned to be a pixel electrode 44. From the above processes, a TFT 45 connecting the pixel electrode 44 is completed.

From the method of forming a silicon oxide layer of the present embodiments, since it use two frequency excitation plasma CVD device and one side electrode 20a of the tuning condenser 20 of the matching box toward the high frequency electrode 9 is used as the high frequency electrode 3 also, the electric power loss of the applied high frequency electric power heavily decreases as compared with the prior art. As the result of, the electric power consumption efficiency increases, and it could obtain the silicon oxide layer with high quality and high formation speed.

Therefore, in the method of manufacturing the TFT with the silicon oxide layer according to the present embodiments, although it may use $N_2O/SiH_4$ based silicon oxide layer as the interspacing layer 37, a good step coverage could be obtained as compared with the prior TEOS based silicon oxide layer. Also, since the insulating pressure is sufficiently high, it could be obtained the gate insulator 33 with a high reliability by $N_2O/SiH_4$ based silicon oxide layer.

Moreover, the present method could use the reaction gas of which main gases are nitrous oxide to monosilane that are very widely used, thus it is able to complete without using the conventional TEOS gas. Hence, there are not the problems that the handle of the gas is difficult and the costs are high, and the yield and productivity of the TFT increase.

Furthermore, it will be apparent to those skilled in the art that various modifications can be made in the present invention without departing from the sprit or scope of the invention. Thus, it is intended that the present invention covers the modifications and variations of this invention provided they come within the scope of the appended claims and their equivalents.

For example, the formation condition of the layer of the CVD, etc. in the above embodiments may be only an example, it is possible to vary thereof. In addition, the present method of manufacturing TFT is applied the top-gate TFT, however, it could apply to a bottom-gate TFT.

And, the plasma CVD device 1 used in the formation of the layer in the FIG. 1 has the side wall of the housing 7 in the matching box toward the high frequency electrode 9 being parallel with the feed wire. As shown in the FIG. 5, however, it is possible to use the side wall of the housing 47 in the matching box toward the high frequency electrode 46 not being parallel with the feed wire 48.

In this plasma CVD device 49, on feeding an electric power, the flowing directions of the going and returning currents of the high frequency current are not parallel with each other, and this prevents the mutual inductance from increasing. As the result of, it improves the electric power consumption efficiency, the formation speed of the silicon oxide layer, and the quality of the layer.

Figure 5:
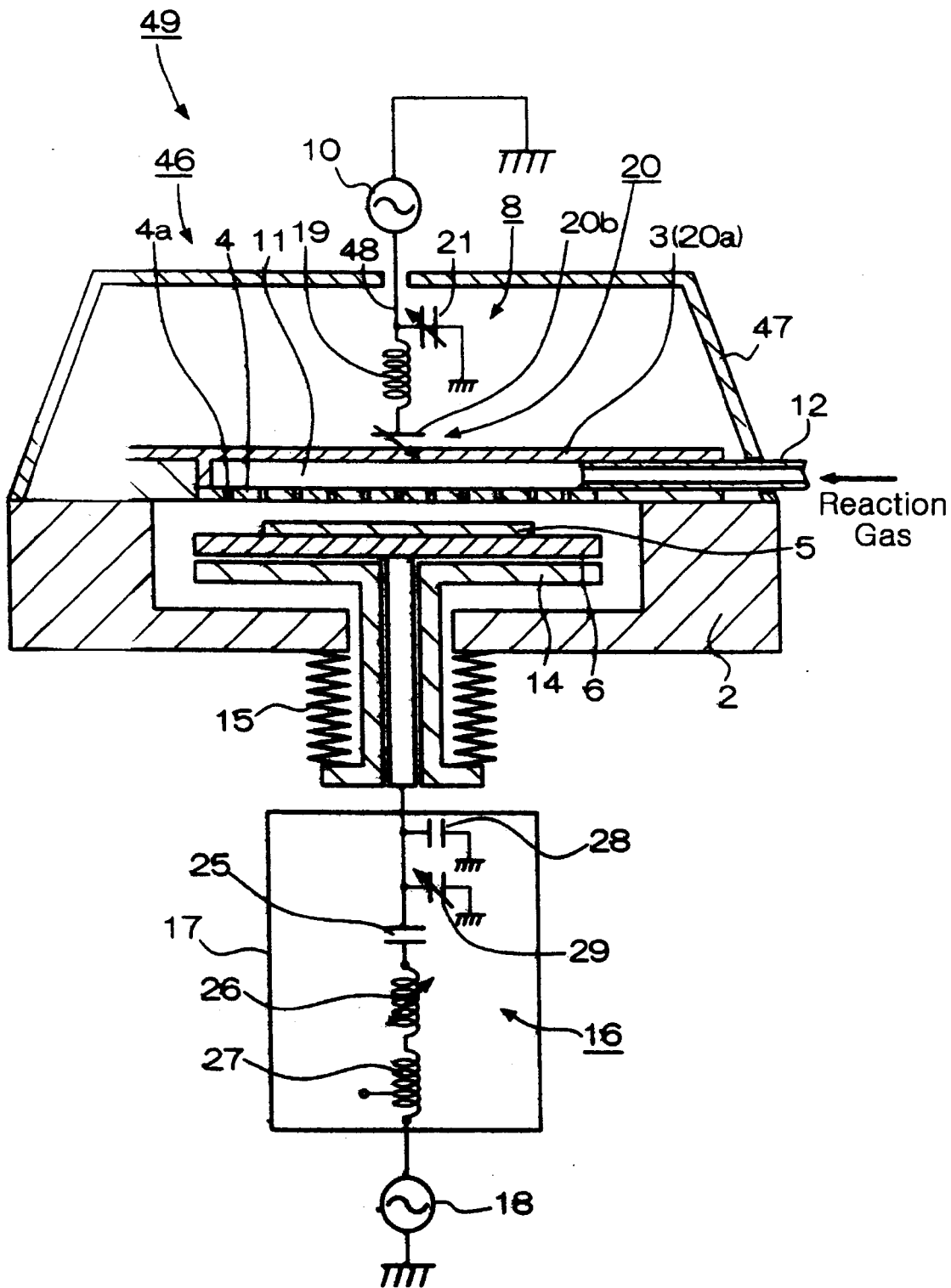
FIG. 5 is a sectional view showing other example of two frequency excitation plasma CVD device used in the method of FIG. 4.

As to the FIG. 5, the same numeric references are applied to the same constituents in the FIG. 1.

EMBODIMENTS

Embodiment 1

The present embodiment formed the silicon oxide layer by using the two frequency excitation plasma CVD device with the matching box described above.

Figure 6:
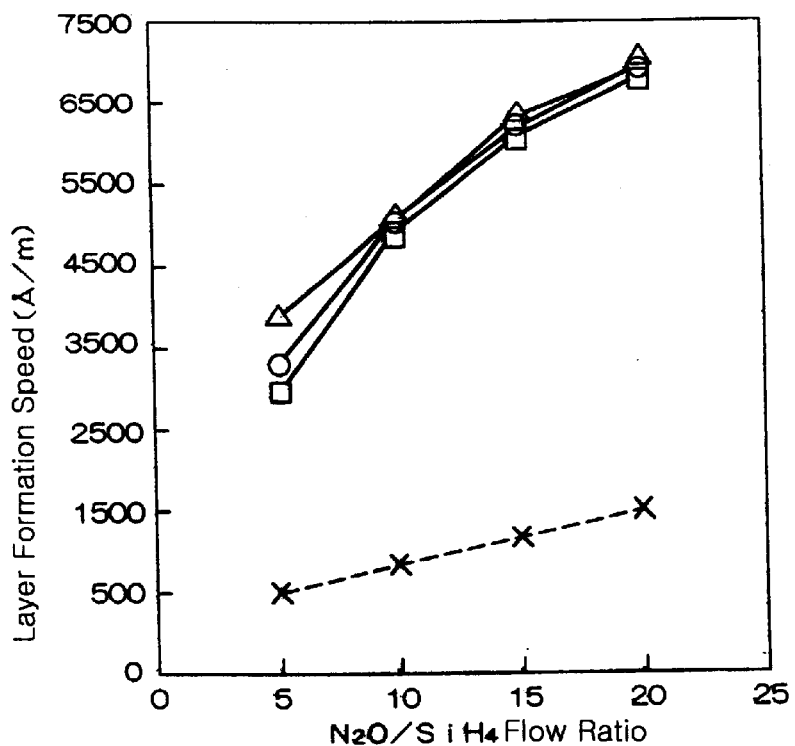
FIG. 6 is a graph showing the relation of $N_2O/SiH_4$ flow ratio versus the formation speed in variation of the substrate bias electric power rate, which represents the results from the first embodiment of the present invention.

FIG. 6 is a graph showing the relation of $N_2O/SiH_4$ flow ratio versus the formation speed in variation of the substrate bias electric power rate($rf_2$) applied to the susceptor electrode when it used the two frequency excitation plasma CVD device of the above embodiment. The horizontal axis represents $N_2O/SiH_4$ flow ratio, and the vertical axis represents the formation speed.

The formation condition of the layer was that the frequency of the high frequency electric power applied to the high frequency electrode was 13.56 MHz, the electric power ($rf_1$) was fixed, the frequency of the substrate bias electric power applied to the susceptor electrode was 1.6 MHz, and the substrate bias electric power rate was 33.3% (this was represented as □ and solid line in the FIG. 6), 50% (this was represented as ○ and solid line in the FIG. 6), and 66.6% (this was represented as Δ and solid line in the FIG. 6). And, the temperature of the substrate was 300° C., the pressure in the chamber is 200 Pa.

The comparative example was performing the same formation of the layer with using the conventional device having only the high frequency electrode that the high frequency electric power of the 13.56 MHz frequency was applied to (this was represented as x and dotted line in the FIG. 6).

As shown in the FIG. 6, in case of the comparative example, the formation speed of the layer was only 1000 Å/min or less when $N_2O/SiH_4$ flow ratio was in range of 5 to 20. On the other hand, in case of the present embodiment, when the substrate bias electric power rate was 33.3%, 50%, 66.6%, the layer formation speed was 2000 Å/min and less or more on the $N_2O/SiH_4$ flow ratio of 5, and 3700 Å/min and less or more on the $N_2O/SiH_4$ flow ratio of 20.

Hence, the present two frequency excitation plasma CVD device improved remarkably the layer formation speed as compared with the conventional device. In addition, in case of the present two frequency excitation plasma CVD device, when $N_2O/SiH_4$ flow ratio was higher, the formation speed of the layer was improved, and when the substrate bias electric power was higher, the formation speed of the layer was improved.

Embodiment 2

The variation of the insulating pressure of the formed silicon oxide layer was investigated according to the applied of the substrate bias electric power.

Figure 7:
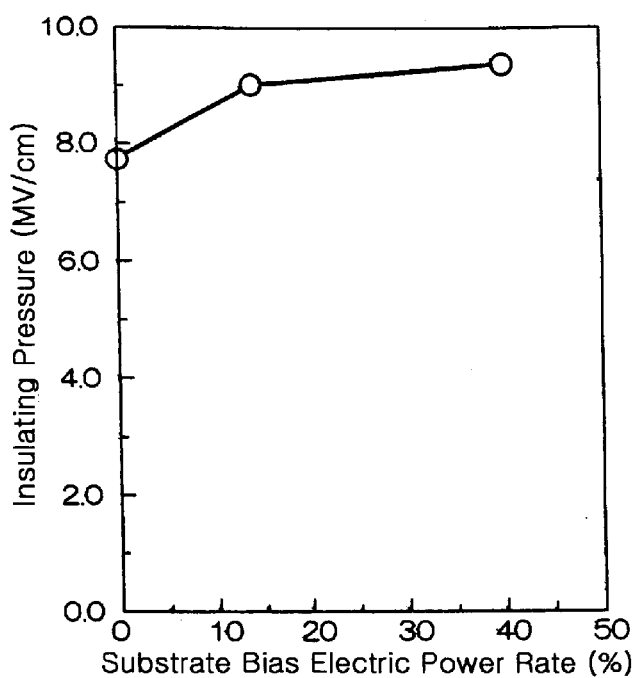
FIG. 7 is a graph showing the relation of the substrate bias electric power rate versus the insulating pressure of the silicon oxide layer, which represents the results from the second embodiment of the present invention.

FIG. 7 is a graph showing the relation of the substrate bias electric power rate versus the insulating pressure of the silicon oxide layer with using the present two frequency excitation plasma CVD device. The horizontal axis represents the substrate bias electric power rate (%), and the vertical axis represents the insulating pressure(MV/cm).

The formation condition of the layer was that the frequency of the high frequency electric power applied to the high frequency electrode was 40.68 MHz, the high frequency electric power $rf_2$ was fixed, the frequency of the substrate bias electric power applied to the susceptor electrode was 1.6 MHz, the substrate bias electric power rate was 0%, 14.3%, 40%. And, the temperature of the substrate was 300° C., the pressure in the chamber is 200 Pa.

As to the reaction gas, the $N_2O/SiH_4$ flow ratio was 15, the flow ratio of the mixing gas of monosilane and nitrous oxide occupied in the reaction gas was 46% (dilution with He), and the layer thickness of the silicon oxide layer was 2000 Å.

Figure 8:
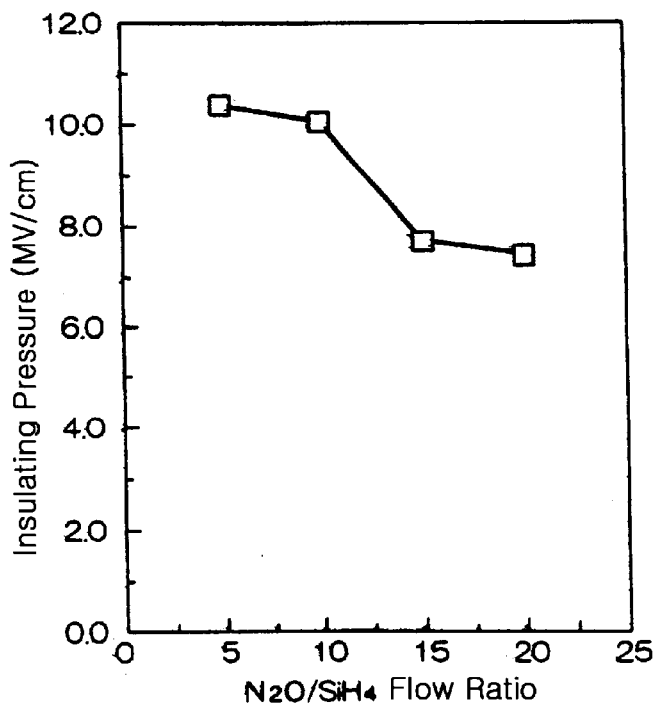
FIG. 8 is a graph showing the relation of $N_2O/SiH_4$ flow ratio versus the insulating pressure of the silicon oxide layer when the substrate bias electric power rate is not applied, which represents the results from the second embodiment of FIG. 7.

FIG. 8 is a graph showing the relation of $N_2O/SiH_4$ flow ratio versus the insulating pressure of the silicon oxide layer when the substrate bias electric power rate is not applied to the susceptor electrode ($rf_2$=0 W). The horizontal axis represents the $N_2O/SiH_4$ flow ratio, and the vertical axis represents the insulating pressure MV/cm.

The formation condition of the layer was that the frequency of the high frequency electric power applied to the high frequency electrode was 13.56 MHz, the electric power $rf_1$ was fixed. And, the temperature of the substrate was 300° C., the pressure in the chamber is 200 Pa.

As to the reaction gas, the $N_2O$ flow ratio was changed after the $SiH_4/He$ flow ratio was fixed 5%, and the thickness of the silicon oxide layer was 2000 Å.

When it did not apply the substrate bias electric power, as shown in the FIG. 8, the insulating pressure was 10 MV/cm or more in range of 5 to 10 of the $N_2O/SiH_4$ flow ratio, however, the insulating pressure decreased to 7 to 8 MV/cm in 15, 20 of the $N_2O/SiH_4$ flow ratio. As shown in the FIG. 7, when the insulating pressure was 7.7 MV/cm in 15 of the $N_2O/SiH_4$ flow ratio, the insulating pressure increased to approximately 9 MV/cm according to applying the substrate bias electric power rate in 14.3%, 40%. Hence, it proved the effect of improving the insulating pressure of the silicon oxide layer by applying the substrate bias electric power.

Embodiment 3

In the present method of forming the silicon oxide layer, the changes of the characteristics of the formed silicon oxide layer were investigated according to the variation of the $N_2O/SiH_4$ flow ratio.

Figure 9:
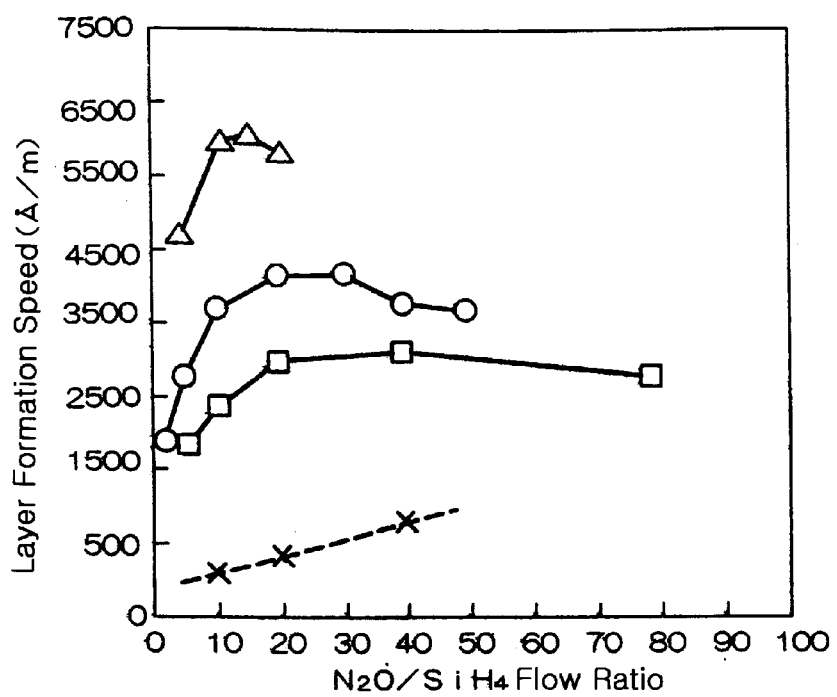
FIG. 9 is a graph showing the relation of $N_2O/SiH_4$ flow ratio versus the formation speed of the silicon oxide layer in variation of $SiH_4$ flow ratio occupied in the reaction gas, which represents the results from the third embodiment of the present invention.

FIG. 9 is a graph showing the relation of $N_2O/SiH_4$ flow ratio versus the formation speed of the silicon oxide layer with using the two frequency excitation plasma CVD device. At this time, $SiH_4$ flow ratio occupied in the reaction gas was 1% (this was represented as □ and solid line in the FIG. 9), 2% (this was represented as ○ and solid line in the FIG. 9), 3% (this was represented as Δ and solid line in the FIG. 9).

In FIG. 9, the horizontal axis represents the $N_2O/SiH_4$ flow ratio, and the vertical axis represents the formation speed of the layer in Å/min.

The formation condition of the layer was that the frequency of the high frequency electric power applied to the high frequency electrode was 40.68 MHz, the frequency of the substrate bias electric power was 1.6 MHz, and the substrate bias electric power rate was 33.3%. And, the temperature of the substrate was 300° C., the pressure in the chamber is 200 Pa.

The comparative example was performing the same formation of the layer with using the conventional device having only the high frequency electrode that the high frequency electric power of the 13.56 MHz frequency was applied to (this was represented as x and dotted line in the FIG. 9).

Figure 10:
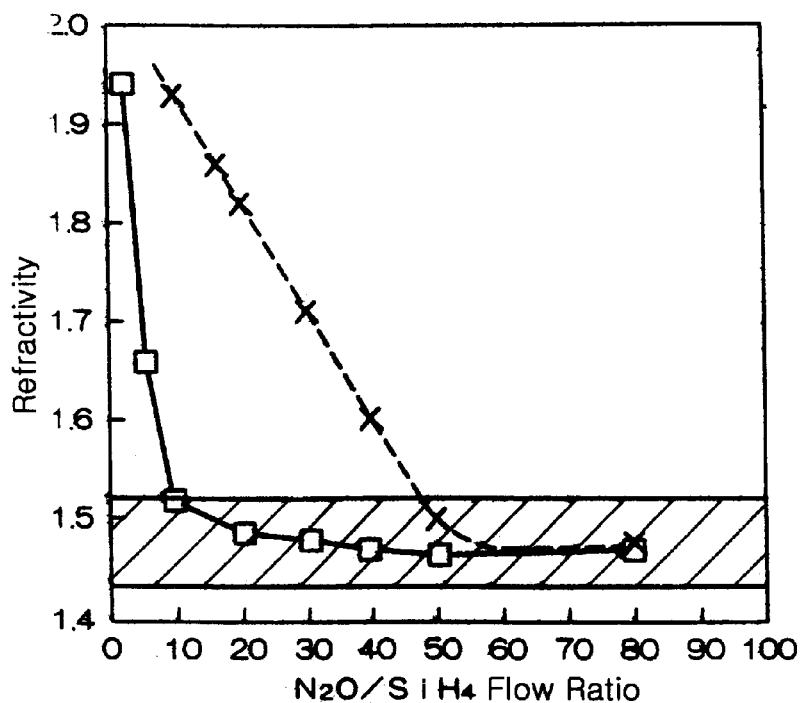
FIG. 10 is a graph showing the relation of $N_2O/SiH_4$ flow ratio versus the refractivity of the silicon oxide layer, which represents the results from the third embodiment of FIG. 9.

FIG. 10 is a graph showing the relation of $N_2O/SiH_4$ flow ratio versus the refractivity of the silicon oxide layer. The horizontal axis represents the $N_2O/SiH_4$ flow ratio, and the vertical axis represents the refractivity in FIG. 10.

The formation condition of the layer was that the frequency of the high frequency electric power applied to the high frequency electrode was 40.68 MHz, the frequency of the substrate bias electric power was 1.6 MHz, and the substrate bias electric power rate was 33.3%. And, the temperature of the substrate was 300° C., the pressure in the chamber is 200 Pa (this was represented as □ and solid line in the FIG. 10).

The comparative example was performing the same formation of the layer with using the conventional device having only the high frequency electrode that the high frequency electric power of the 13.56 MHz frequency was applied to (this was represented as x and dotted line in the FIG. 10).

As shown in the FIG. 9, in case of comparative example the formation speed of the layer was 500 to 1500 Å/min in range of 5 to 50 of the $N_2O/SiH_4$ flow ratio. However, in the present embodiment, when $SiH_4$ flow ratio occupied in the reaction gas was 1%, 2%, 3%, the formation speed of the layer was so high as compared with the comparative example.

From the data of the present embodiment, when the $SiH_4$ flow ratio was larger, the formation speed of the layer was higher, and when the layer formation speed was 3000 Å/min and less or more on the $SiH_4$ flow ratio of 1%, it increases to 6000 Å/min on the $SiH_4$ flow ratio of 3%.

From the data on the $SiH_4$ flow ratio being constant, when the $N_2O/SiH_4$ flow ratio was in range of 0 to 10, the formation speed of the layer increased rapidly, and then when the $N_2O/SiH_4$ flow ratio was 10 or more, the formation speed of the layer was approximately constant.

From the above results, since the stability and management of the layer were so good, it was preferable that it used the present high frequency excitation plasma CVD device and the $N_2O/SiH_4$ flow ratio was 10 or more.

Furthermore, in case of the comparative example as shown in the FIG. 10, when the $N_2O/SiH_4$ flow ratio increased from 10 to 50, the refractivity gradually intended to decrease from 2, and when the $N_2O/SiH_4$ flow ratio was approximately 50, the refractivity was in range of 1.4 to 1.5. When the range which the refractivity represented by the solid line was 1.4 to 1.5 was the region that $SiO_2$ had the stoichiometric structure thereof, and the fact that the refractivity had the above value represented that the formed layer surely would be $SiO_2$.

In case of the present embodiment as compared with the above, when the $N_2O/SiH_4$ flow ratio was in range of 0 to 10, the refractivity rapidly decreased, and when the $N_2O/SiH_4$ flow ratio was 10, the refractivity was in range of 1.4 to 1.5 and maintained the value in this range.

From the above results, when it used the present two frequency excitation plasma CVD device and the $N_2O/SiH_4$ flow ratio was 10 or more, it would obtain the silicon oxide layer having stoichiometric structure.

Embodiment 4

In the present method of forming the silicon oxide layer, the effect of other gases added to the main reaction gas to the layer formation was investigated.

Figure 11:
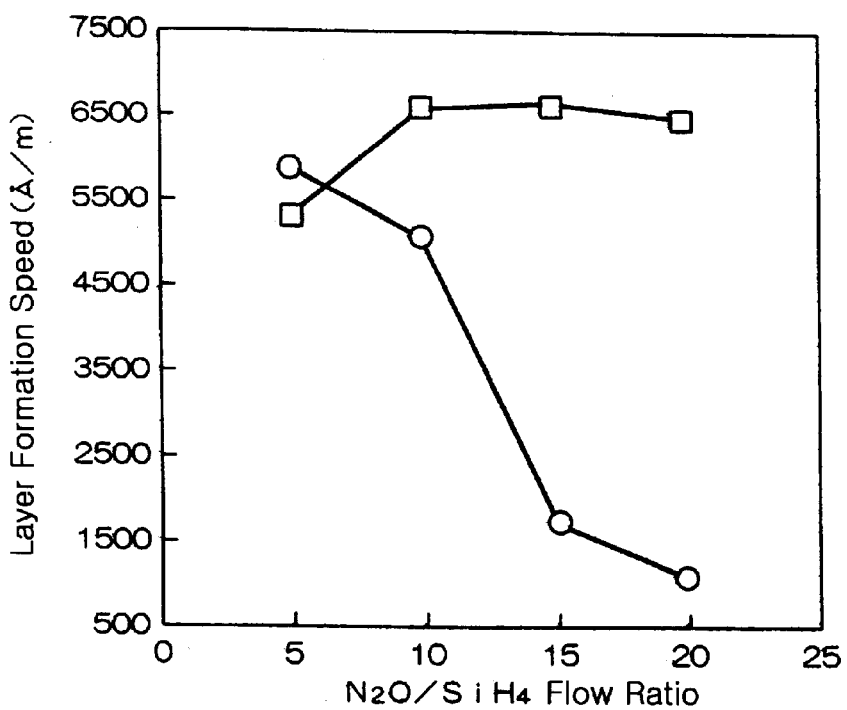
FIG. 11 is a graph showing the relation of $N_2O/SiH_4$ flow ratio versus the formation speed of the silicon oxide layer in each case of adding and non-adding He gas into the main reaction gas, which represents the results from the fourth embodiment of the present invention.

FIG. 11 is a graph showing the relation of $N_2O/SiH_4$ flow ratio versus the formation speed of the silicon oxide layer in each case of adding (this was represented as □ and solid line in the FIG. 11) and non-adding (this was represented as ○ and solid line in the FIG. 11) He gas into the main reaction gas, $N_2O/SiH_4$ with using the present two frequency excitation plasma CVD device. In case of adding He gas, the flow was 800 sccm. The horizontal axis represents the $N_2O/SiH_4$ flow ratio, and the vertical axis represents the formation speed of the layer Å/min.

The formation condition of the layer was that the frequency of the high frequency electric power applied to the high frequency electrode was 40.68 MHz, the frequency of the substrate bias electric power was 1.6 MHz, and the substrate bias electric power rate was 33.3%. And, the temperature of the substrate was 300° C., the pressure in the chamber is 200 Pa.

Figure 12:
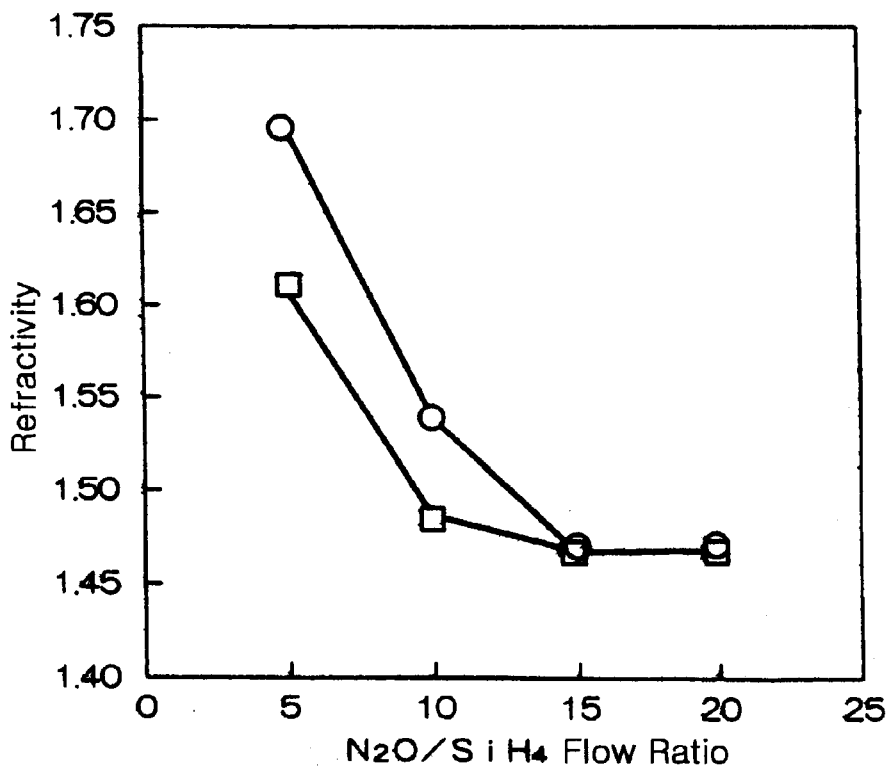
FIG. 12 is a graph showing the relation of $N_2O/SiH_4$ flow ratio versus the refractivity of the silicon oxide layer in each case of adding and non-adding He gas into the main reaction gas, which represents the results from the fourth embodiment of FIG. 11.
Figure 13:
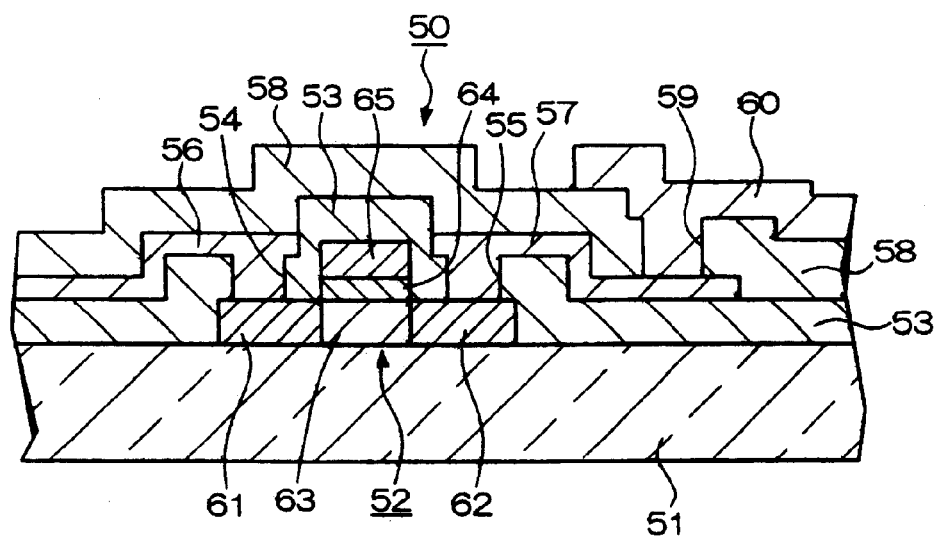
FIG. 13 is a sectional view showing a conventional top-gate TFT.

FIG. 12 is a graph showing the relation of $N_2O/SiH_4$ flow ratio versus the refractivity of the silicon oxide layer in each case of adding (this was represented as □ and solid line in the FIG. 12) and non-adding (this was represented as ○ and solid line in the FIG. 12) He gas into the main reaction gas $N_2O/SiH_4$. The horizontal axis represents the $N_2O/SiH_4$ flow ratio, and the vertical axis represents the refractivity.

The formation condition of the layer was that the frequency of the high frequency electric power applied to the high frequency electrode was 40.68 MHz, the frequency of the substrate bias electric power was 1.6 MHz, and the substrate bias electric power rate was 33.3%. And, the temperature of the substrate was 300° C., the pressure in the chamber is 200 Pa.

As shown in the FIG. 11, in case of non-adding He gas, when the $N_2O/SiH_4$ flow ratio exceeded 10, the formation speed of the layer decreased rapidly. However, in case of adding He gas in 800 sccm of flow, although the $N_2O/SiH_4$ flow ratio was changed, it was able to maintain stable the rapid formation of the present silicon oxide layer.

Further, as shown in the FIG. 12, in case of adding He gas as compared with the case of non-adding He gas, the change rate of the refractivity to the $N_2O/SiH_4$ flow ratio decreased, and when the $N_2O/SiH_4$ flow ratio was in more smaller range, the refractivity was in range of 1.4 to 1.5 (stoichiometric structure range). Hence, as to the composition of the silicon oxide layer, the stability of the case of adding He gas was more preferable.

As described above, from the results of the first to fourth embodiments, the improvement of the formation speed of the silicon oxide layer and the insulating pressure was proved by using the two frequency excitation plasma CVD device and by using the main reaction gas which $N_2O/SiH_4$ flow ratio being 10 over in added the other gas such as He, etc.

Further particularly, it could be obtained the silicon oxide layer preferably used as the interspacing insulator being required the step coverage and the gate insulator being required the reliability in the insulating pressure.

Consequently, from using the present two frequency excitation plasma CVD device having the matching box, the electric power consumption efficiency is improved, and the formation speed of the layer increases. And the formation speed of the layer on a substrate increases by the effect of applying the substrate bias electric power, the step coverage thereof would be good.

Therefore, the $N_2O/SiH_4$ based silicon oxide layer is able to be used as the interspacing insulator as the conventional TEOS based silicon oxide layer is. Furthermore, since the improvement of the layer quality, particularly, the improvement of the insulating pressure is obtained, it is possible to apply to the gate insulator.

Consequently, the TFT with high reliability could be obtained accompanying a good yield without using the TEOS based silicon oxide layer having the problem of handling the material gas and of the costs.

It will be apparent to those skilled in the art that various modifications and variation can be made in the method of forming silicon oxide layer of the present invention without departing from the spirit or scope of the invention. Thus, it is intended that the present invention cover the modifications and variations of this invention provided they come within the scope of the appended claims and their equivalents.

What is claimed is:

1. A method of forming a silicon oxide layer comprising the steps of:

providing two frequency excitation plasma CVD device, the device having a susceptor electrode and a high frequency electrode;

placing the substrate on the susceptor electrode;

applying a high frequency electric power on the high frequency electrode and the susceptor electrode respectively; and forming a silicon oxide layer on the substrate by generating plasma with using a reaction gas in which a flow ratio of the mixing gas of monosilane and nitrous oxide is 10 to 50%.

2. The method according to claim 1, wherein the two frequency excitation plasma CVD device comprises:

a first high frequency power supply;

a high frequency electrode connected to the first high frequency power supply;

a matching box toward the high frequency electrode having a matching circuit between the first high frequency power supply and the high frequency electrode;

a second high frequency power supply;

a susceptor electrode connected to the second high frequency power supply; and a matching box toward the susceptor electrode having a matching circuit between the second high frequency power supply and the susceptor electrode, wherein the matching circuit of the matching box toward the high frequency electrode includes a tuning condenser having at least two electrodes, wherein one of the two electrodes is the high frequency electrode.

3. The method according to claim 1, wherein the flow ratio of nitrous oxide to monosilane is 10 or more.

4. The method according to claim 1, wherein the reaction gas includes a gas selected from the group consisting of helium, hydrogen, xenon, oxygen, argon, nitrogen and a mixture thereof.

5. The method according to claim 2, wherein a frequency of high frequency electric power applied to the high frequency electrode is in range of 13.56 MHz to 100 MHz and a frequency of high frequency electric power applied to the susceptor electrode is in range of 50 kHz to 1.6 MHz.

6. The method according to claim 2, wherein a side wall of a housing consisting of a conductive material in the matching box toward the high frequency electrode is non-parallel with a feed wire, the housing stores the feed wire providing the high frequency electrode with the high frequency electric power of the first high frequency power supply through the matching circuit and the matching circuit.

7. A method of manufacturing a thin film transistor having a gate insulator and an interspacing insulator each comprising a silicon oxide layer, the method comprising forming the gate insulator and the interspacing insulator by the method of claim 1.

8. A method of manufacturing a thin film transistor, comprising:

forming a semiconductor layer on a substrate;

exposing the substrate to a reaction gas to form a gate insulator on the semiconductor layer, wherein the reaction gas includes a mixture gas of monosilane and nitrous oxide having a flow ratio of between 10% and 50%;

forming a gate electrode on the gate insulator;

forming source and drain regions in the semiconductor layer except beneath the gate electrode;

exposing the substrate to a reaction gas to form an interspacing insulator over the substrate, wherein the reaction gas includes a mixture gas of monosilane and nitrous oxide having a flow ratio of between 10% and 50%; and forming source and drain electrodes on the interspacing insulator.

9. The method of claim 8, further comprising:

forming a passivation layer over the substrate; and forming a pixel electrode on the passivation layer.

10. The method of claim 9, wherein the passivation layer includes a silicon nitride layer.

11. The method of claim 8, wherein the gate insulator layer includes a silicon nitride layer.

12. The method claim 8, wherein the interspacing insulator includes a silicon oxide layer.

13. The method of claim 8, wherein a ratio of nitrous oxide to monosilane in the mixture gas is at least 10.

14. The method of claim 8, wherein the reaction gas further includes a gas selected from a group consisting of helium, hydrogen, xenon, oxygen, argon, nitrogen and a mixture thereof.

15. The method of claim 8, wherein the semiconductor layer is amorphous silicon.

16. The method of claim 8, wherein the semiconductor layer is polysilicon.

17. A method of manufacturing a thin film transistor using a chemical vapor deposition (CVD) apparatus comprising a first frequency power supply, a first electrode connected to the first frequency power supply, a second frequency power supply, a second electrode connected to the second frequency power supply, and a gas inlet, the method comprising:

forming a semiconductor layer on a substrate;

placing the substrate on the second electrode of the CVD apparatus;

applying electric power having a first frequency from the first frequency power supply to the first electrode, while applying electric power having a second frequency from the second frequency power supply to the second electrode, and while providing a reaction gas to the substrate via the gas inlet to form a gate insulator over the semiconductor layer;

forming a gate electrode on the gate insulator;

forming source and drain regions in the semiconductor layer;

forming an interspacing insulator over the substrate; and forming source and drain electrodes on the interspacing insulator and contacting the source and drain regions respectively.

18. The method of claim 17, wherein the reaction gas includes a mixture gas of monosilane and nitrous oxide having a flow ratio of between 10% and 50%.

19. The method of claim 18, wherein a ratio of nitrous oxide to monosilane in the mixture gas is at least 10.

20. The method of claim 17, wherein the reaction gas further includes a gas selected from a group consisting of helium, hydrogen, xenon, oxygen, argon, nitrogen and a mixture thereof.

21. The method of claim 17, wherein the semiconductor layer comprises amorphous silicon.

22. The method of claim 17, wherein the semiconductor layer comprises polysilicon.

23. The method of claim 17, wherein the first frequency is between 13.56 MHz and 100 MHz.

24. The method of claim 17, wherein the second frequency is between 50 kHz and 1.6 MHz.

25. The method of claim 17, wherein the first frequency is about 40.68 MHz.

26. The method of claim 17, wherein the first frequency is about 27.12 MHz.

27. The method of claim 17, wherein forming the interspacing insulator over the substrate comprises:

placing the substrate on the second electrode of the CVD apparatus; and applying the electric power having the first frequency from the first frequency power supply to the first electrode, while applying the electric power having the second frequency from the second frequency power supply to the second electrode, and while providing the reaction gas to the substrate via the gas inlet.

28. A method of manufacturing a thin film transistor using a chemical vapor deposition (CVD) apparatus comprising a first frequency power supply, a first electrode connected to the first frequency power supply, a second frequency power supply, a second electrode connected to the second frequency power supply, and a gas inlet, the method comprising:

forming a semiconductor layer on a substrate;

forming a gate insulator;

forming a gate electrode on the gate insulator;

forming source and drain regions in the semiconductor layer;

placing the substrate on the second electrode of the CVD apparatus;

applying electric power having a first frequency from the first frequency power supply to the first electrode, while applying electric power having a second frequency from the second frequency power supply to the second electrode, and while providing a reaction gas to the substrate via the gas inlet to form an interspacing insulator over the substrate; and forming source and drain electrodes on the interspacing insulator and contacting the source and drain regions respectively.

29. The method of claim 28, wherein the reaction gas includes a mixture gas of monosilane and nitrous oxide having a flow ratio of between 10% and 50%.

30. The method of claim 29, wherein a ratio of nitrous oxide to monosilane in the mixture gas is at least 10.

31. The method of claim 28, wherein the reaction gas further includes a gas selected from a group consisting of helium, hydrogen, xenon, oxygen, argon, nitrogen and a mixture thereof.

32. The method of claim 28, wherein the semiconductor layer comprises amorphous silicon.

33. The method of claim 28, wherein the semiconductor layer comprises polysilicon.

34. The method of claim 28, wherein the first frequency is between 13.56 MHz and 100 MHz.

35. The method of claim 28, wherein the second frequency is between 50 kHz and 1.6 MHz.

36. The method of claim 28, wherein the first frequency is about 40.68 MHz.

37. The method of claim 28, wherein the first frequency is about 27.12 MHz.

* * * * *